(12) United States Patent
Shibayama

(10) Patent No.: US 8,389,322 B2
(45) Date of Patent: Mar. 5, 2013

(54) PHOTODIODE ARRAY, METHOD OF MANUFACTURING THE SAME, AND RADIATION DETECTOR

(75) Inventor: Katsumi Shibayama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 360 days.

(21) Appl. No.: 12/656,175

(22) Filed: Jan. 20, 2010

(65) Prior Publication Data

US 2010/0123081 A1 May 20, 2010

Related U.S. Application Data

(62) Division of application No. 10/548,487, filed as application No. PCT/JP2004/003118 on Mar. 10, 2004, now Pat. No. 7,727,794.

(30) Foreign Application Priority Data

Mar. 10, 2003 (JP) ................ P2003-063891

(51) Int. Cl.
*H01L 21/00* (2006.01)
(52) U.S. Cl. ............ 438/78; 438/75; 257/233; 257/443; 257/444; 257/446; 257/448
(58) Field of Classification Search .............. 257/443, 257/444, 446, 448; 438/73, 75, 78
See application file for complete search history.

(56) References Cited

U.S. PATENT DOCUMENTS

| | | | |
|---|---|---|---|
| 4,131,984 A | 1/1979 | Kaplow et al. | |
| 5,189,297 A | 2/1993 | Ahlgren | |
| 5,548,122 A | 8/1996 | Shoji | |
| 5,886,359 A | 3/1999 | Bringley et al. | |
| 6,194,258 B1 | 2/2001 | Wuu | |
| 6,211,524 B1 | 4/2001 | Vardeny et al. | |
| 6,326,652 B1 | 12/2001 | Rhodes | |
| 6,462,365 B1 | 10/2002 | He et al. | |
| 2002/0153492 A1 | 10/2002 | Sekine et al. | |
| 2002/0159563 A1* | 10/2002 | Tashiro et al. | 378/98.8 |
| 2003/0038326 A1 | 2/2003 | Fasen et al. | |
| 2003/0042425 A1* | 3/2003 | Tashiro et al. | 250/370.11 |
| 2003/0223214 A1 | 12/2003 | Hayashi | |
| 2006/0138330 A1* | 6/2006 | Baldwin et al. | 250/357.1 |
| 2007/0090477 A1* | 4/2007 | Shibayama | 257/431 |

FOREIGN PATENT DOCUMENTS

| | | |
|---|---|---|
| JP | 2001-318155 | 11/2001 |
| JP | 2001-339057 | 12/2001 |
| JP | 2002-031687 | 1/2002 |
| JP | 2002-048870 | 2/2002 |
| JP | 2002-048872 | 2/2002 |
| JP | 2002-270808 | 9/2002 |
| JP | 2003-066150 | 3/2003 |

(Continued)

*Primary Examiner* — N Drew Richards
*Assistant Examiner* — Joannie A Garcia
(74) *Attorney, Agent, or Firm* — Drinker Biddle & Reath LLP

(57) ABSTRACT

A theme is to prevent the generation of noise due to damage in a photodetecting portion in a mounting process in a photodiode array, a method of manufacturing the same, and a radiation detector. In a photodiode array, wherein a plurality of photodiodes (4) are formed in array form on a surface at a side of an n-type silicon substrate (3) onto which light to be detected is made incident and penetrating wirings (8), which pass through from the incidence surface side to the back surface side, are formed for the photodiodes (4), the photodiode array (1) is arranged with a transparent resin film (6), which covers the formed regions of the photodiodes (4) and transmits the light to be detected, provided at the incidence surface side.

9 Claims, 17 Drawing Sheets

FOREIGN PATENT DOCUMENTS

| | | |
|---|---|---|
| JP | 2003-068779 | 3/2003 |
| JP | 2003066149 | 3/2003 |
| JP | 2004-273848 | 9/2004 |
| TW | 275717 | 5/1996 |
| TW | 493073 | 7/2002 |

* cited by examiner

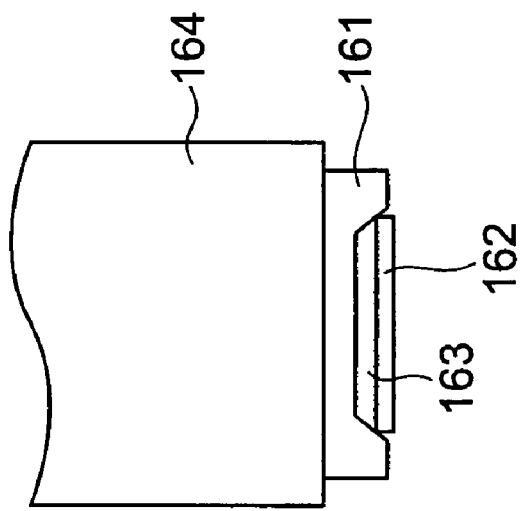
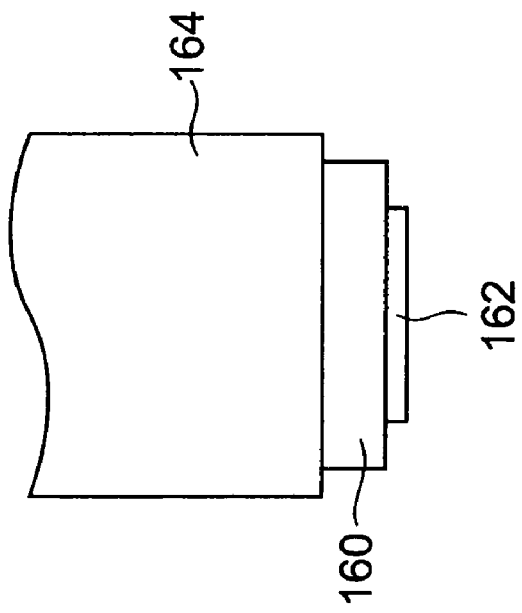

PHOTODIODE ARRAY, METHOD OF MANUFACTURING THE SAME, AND RADIATION DETECTOR

This is a divisional application of application Ser. No. 10/548,487, having a §371 date of Jun. 27, 2006, now U.S. Pat. No. 7,727,794, which is a national stage filing based on PCT International Application No. PCT/JP2004/003118, filed on Mar. 10, 2004. The copending application Ser. No. 10/548,487 is incorporated by reference herein in its entirety.

TECHNICAL FIELD

This invention concerns a photodiode array, a method of manufacture thereof, and a radiation detector.

BACKGROUND ART

Among photodiode arrays, there is known since priorly a front surface incidence type photodiode array, wherein output signals from the photodiode array are electrically connected to the back surface side by means of penetrating wirings (electrodes) that connect a light-incident surface side and a back surface side (see, for example, Japanese Published Unexamined Patent Application No. 2001-318155). As shown in FIG. 17, with the photodiode array disclosed in this publication, wirings 152 are formed on a front surface of the photodiode array 144 to take out signals from the respective diffusion layers 151 where the photodiodes 144a, 144b, 144c, ... 144n, which are the main bodies of a photoelectric conversion unit, are formed, and each wiring 152 is extended so as to be connected to the penetrating wiring 154 that passes through from the front to the back of the Si substrate 153. Also at the back surface side of each photodiode 144 is formed the bump 155, connected to the penetrating wiring 154, and the intervals between the Si substrate 153 and the wirings 152 and the penetrating wirings 154 are insulated by the insulating films 156a, 156b, and 156c, which are silicon oxide films.

DISCLOSURE OF THE INVENTION

In mounting an above-described photodiode array, that is for example, the CT photodiode array, a flat collet or a pyramidal collet can be used as the collet for suctioning of the chip, and normally when flip-chip bonding is performed, a flat collet is used. The CT photodiode array is large in chip area (that is, for example, has a rectangular shape with one side being 20 mm in length), and as shown in FIG. 16B, when the pyramidal collet 161 that is normally used in a mounter is used, warping occurs due to the gap 163 that forms between the chip 162 and the pyramidal collet 161 and positional deviation may occur due to this warping and cause lowering of the mounting precision. Also, heating and pressurization are required in the process of flip-chip bonding, and with the pyramidal collet 161, the heat conduction efficiency is poor and the edges of the chip may become damaged due to the applied pressure. The pyramidal collet 161 is thus not suited for a thin chip. Due to these reasons, in performing flip-chip bonding, heat and pressure are applied to the chip 162 from a heater block 164 while the suctioning chip 162 by the flat collet 160 that comes in planar contact with the chip surface as shown in FIG. 16A.

However, when the flat collet 160 is used, the entire chip surface of the chip 162 contacts the flat collet 160. With this chip 162, the chip surface that contacts the flat collet 160 is the light-incident surface at which are formed the impurity diffusion layers that make up the photodetecting portion, that is, the photodiode array. If the entirety of this chip surface that is to be the light-incident surface is subject to pressurization and heating while being in contact with the flat collet 160, the photodetecting portion itself receives physical damage. Appearance defects and degradation of characteristics (increased dark current and noise, etc.) due to surface flaws thus occur at the photodetecting portion.

Thus an object of this invention is to provide a photodiode array, a manufacturing method thereof, and a radiation detector, with which the above issues are resolved and the degradation of characteristics due to damage of the photodiode array in the mounting process can be prevented.

In order to resolve the above object, this invention provides a photodiode array comprising: a semiconductor substrate, wherein a plurality of photodiodes are formed in array form on a surface onto which light to be detected is made incident; and is characterized in that the semiconductor substrate has penetrating wirings, which pass through from the incidence surface side to the back surface side, formed for the photodiodes, and a resin film, which covers at least the regions at which the photodiodes are formed and transmits the light to be detected, is disposed on the incidence surface side of the semiconductor substrate.

With this photodiode array, since the resin film intervenes between the regions at which the photodiodes are formed and a flat collet that is used in the mounting process, the photodiodes are protected and prevented from directly contacting the flat collet used in mounting by the resin film and will thus not receive stress due to pressurization and stress due to heating.

Preferably with the above-described photodiode array, the above-mentioned resin film is disposed over the entire incidence surface side of the semiconductor substrate. With this photodiode array, the entire formed regions of the respective photodiodes can be covered securely by the resin film and moreover the photodiode array can be manufactured readily.

Also with the above-described photodiode array, the semiconductor substrate has impurity regions (separation layers), which separate the respective photodiodes, disposed between the adjacent photodiodes. With these photodiode arrays, since surface leakage is restrained by the separation layers, the adjacent photodiodes are electrically separated securely.

This invention provides a photodiode array manufacturing method comprising: the first step of forming, in a semiconductor substrate, formed of a semiconductor of a first conductive type, penetrating wirings that pass through between the respective surfaces of the semiconductor substrate; the second step of adding an impurity to predetermined regions of a surface at one side of the semiconductor substrate to form a plurality of impurity diffusion layers of the second conductive type and forming a plurality of photodiodes arrayed in array form from the respective impurity diffusion layers and the semiconductor substrate; and the third step of providing on the surface at one side of the semiconductor substrate, a resin film that covers at least the regions at which the photodiodes are formed and transmits light to be detected.

With this photodiode array manufacturing method, a photodiode array can be manufactured upon providing a resin film, which covers the photodiode formed regions, on the incidence surface side of the semiconductor substrate.

In the above-described photodiode array manufacturing method, the above-described first step may comprise: a step of forming a plurality of hole portions in the semiconductor substrate; a step of forming a conductive coating film on the surface of at least one side of the semiconductor substrate including the respective hole portions; and a step of polishing the semiconductor substrate to remove the conductive coating film.

With each of the above photodiode array manufacturing methods, subsequent the above-described first step, a step, of adding, between adjacent regions to which the impurity is to be added, another impurity to form impurity regions of the first conductive type, may be provided. With this manufacturing method, a photodiode array wherein adjacent photodiodes are separated securely can be provided.

Furthermore, this invention provides a radiation detector comprising: any of the above-described photodiode arrays; and a scintillator panel, mounted to the side of the photodiode array onto which the light to be detected is made incident and emits light due to incident radiation.

This invention also provides a radiation detector, comprising: the photodiode array manufactured by any of the above-described manufacturing methods; and a scintillator panel, mounted to the side of the photodiode array on which the above-mentioned resin film is provided and emits light due to incident radiation.

Since each of these radiation detectors is equipped with the above-described photodiode array, the photodiodes that are formed on the light-incident surface side are protected by the resin film and prevented from receiving damage due to pressurization and heating in the mounting process and degradation of characteristics due to the increase of noise and dark current, etc. by such damage is thus prevented.

BRIEF DESCRIPTION OF THE DRAWINGS

FIG. 16A is a sectional view schematically showing a state wherein a semiconductor chip is suctioned by a collet and shows a state of suctioning by a flat collet.

FIG. 16B is a sectional view schematically showing a state wherein a semiconductor chip is suctioned by a collet and shows a state of suctioning by a pyramidal collet.

BEST MODES FOR CARRYING OUT THE INVENTION

Embodiments of this invention shall now be described. The same symbols shall be used for the same elements and redundant description shall be omitted.

Figure 1:
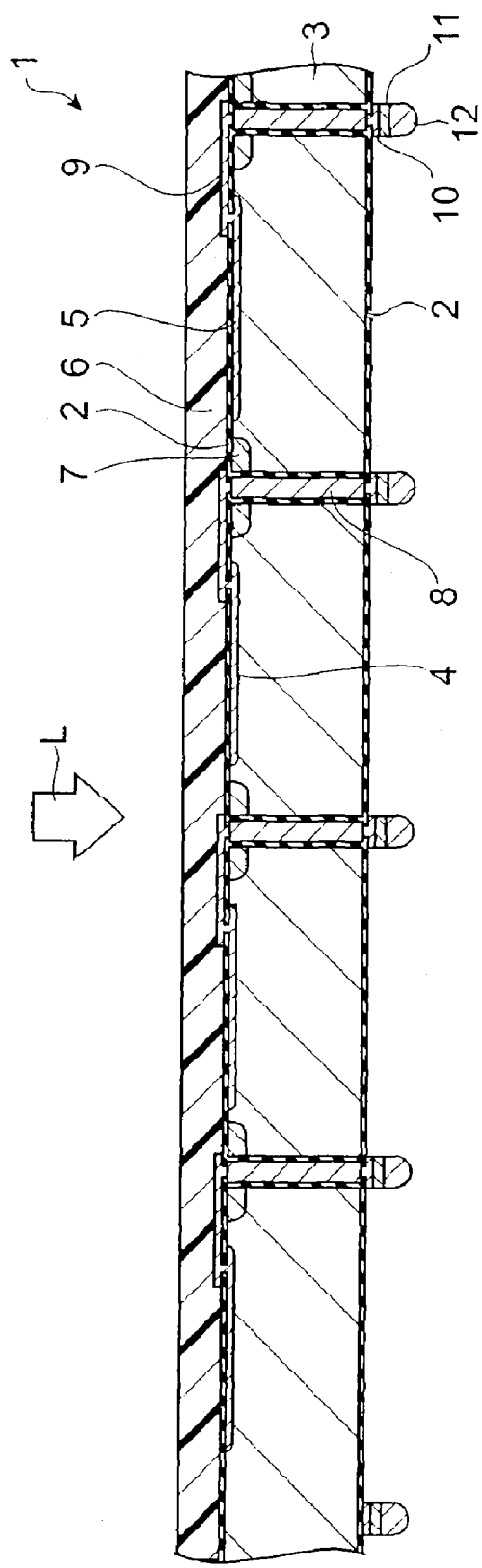
FIG. 1 is a sectional view showing, in enlarged and schematic manner, the principal portions of a photodiode array of an embodiment.

FIG. 1 is a sectional view that schematically shows the photodiode array 1 of an embodiment of this invention. In the description that follows, the surface of incidence of light L shall be called as the front surface and the surface at the opposite side shall be called as the back surface. In the respective FIGURES, the dimensions are differed as suited for the convenience of illustration.

Photodiode array 1 has the plurality of photodiodes 4, formed of pn junctions that are arrayed two-dimensionally in a regular array form in the vertical and horizontal directions, and each photodiode 4 functions as a single pixel of photodiode array 1, which, as a whole, makes up a single photodetecting portion.

The photodiode array 1 has the n-type (first conductive type) silicon substrate 3 with a thickness of approximately 150 to 500 μm (preferably 400 μm) and an impurity concentration of approximately $1 \times 10^{12}$ to $10^{15}/cm^3$. The passivation films 2, formed of $SiO_2$ of a thickness of approximately 0.05 to 1 μm (preferably 0.1 μm), are formed on the front surface and back surface of the n-type silicon substrate 3. Also the photodiode array 1 has, on its front surface side, the p-type (second conductive type) impurity diffusion layer 5, with an impurity concentration of approximately $1 \times 10^{15}$ to $10^{20}/cm^3$ and a film thickness of 0.05 to 20 μm (preferably 0.2 μm), arrayed in a regular array form horizontally and vertically. The pn junctions, formed by the respective p-type impurity diffusion layers 5 and the n-type silicon substrate 3, make up the photodiodes 4.

The regions at which the respective p-type impurity diffusion layers 5 exist are the regions at which the photodiodes 4 are formed (formed regions), the regions besides these are non-formed regions where photodiodes are not formed, and on the front surface side, the transparent resin film 6, which can cover at least the entirety of the formed regions of the photodiodes 4, is disposed across the entire front surface side.

Since this transparent resin film 6 serves as a protective film for the photodetecting portion that comprises the entireties of the photodiodes 4 and is positioned at the incidence surface side, it comprises a light transmitting resin, which transmits the light detected by the photodiode array 1 (light to be detected, for example, the fluorescence generated by the scintillator panel 31 to be described later) and is optically transparent to the light to be detected, that is, for example, an epoxy resin, polyimide, silicone, fluorine resin, acrylate, etc. or a composite material having these resins as the base material.

Also, since the transparent resin film 6 contacts a flat collet and is pressurized and heated in the process of flip-chip bonding as shall be described later, it preferably has the characteristic of exhibiting a function as a cushion layer that protects the respective photodiodes 4 from the pressurization and the heating. In this case, the resin film preferably has a thermal expansion coefficient of approximately $1\times10^{-6}$ to $1\times10^{-4}/°$C., an elastic modulus of approximately 10 to 12000 kg/cm² in regard to elastic characteristics, a thermal conductivity of 0.2 to 1.85 W/mK, and a film thickness by which impurity ions will not diffuse to the photodiodes 4 by heating and yet at least enable absorption of light from the scintillator panel 31 to be described later (approximately 1 to 50 μm (preferably 10 μm)).

Figure 14:
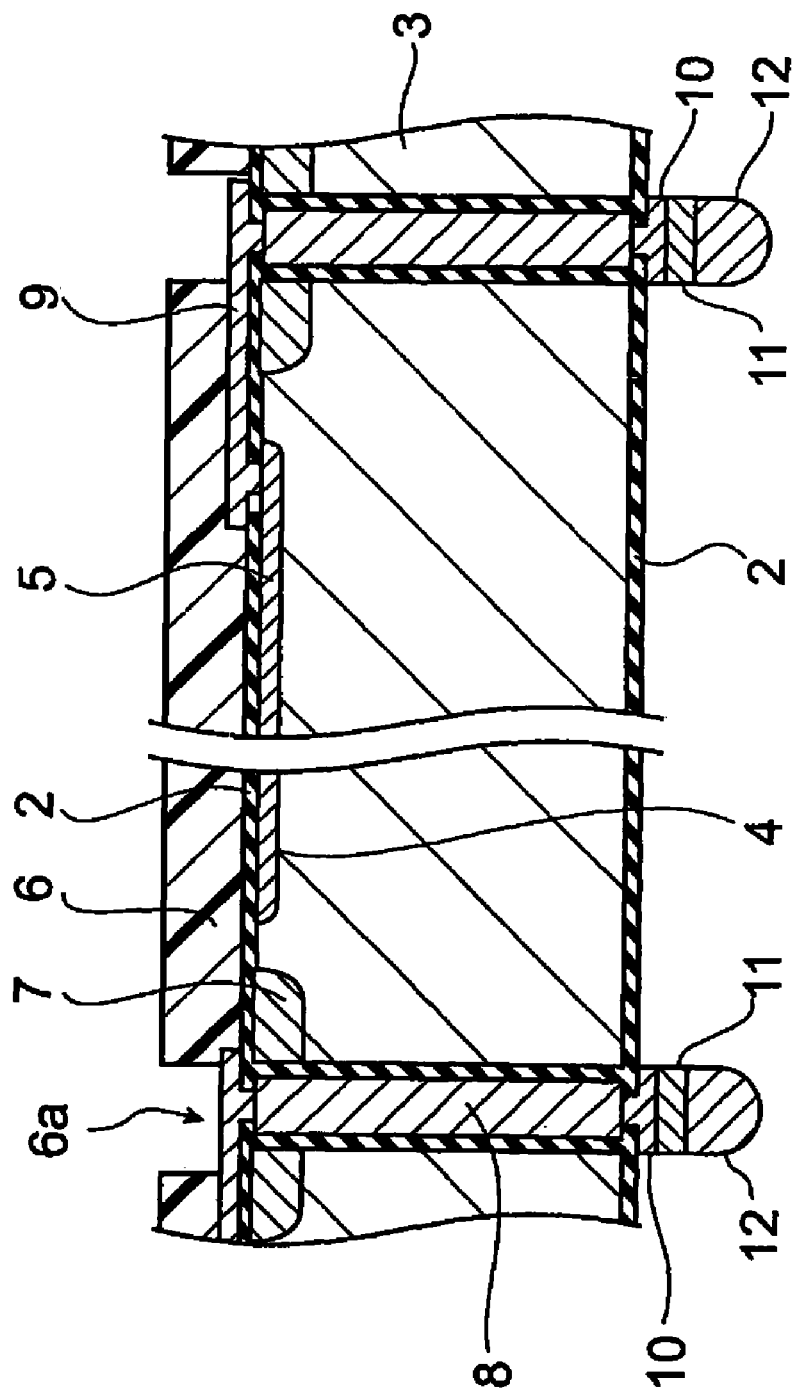
FIG. 14 is a sectional view showing, in an enlarged and schematic manner, the principal parts of a photodiode array with a transparent resin film with omitted portions.

This transparent resin film 6 is disposed over a range that can cover at least the entirety of the formed regions of the photodiodes 4. As long as this requirement is met, a single transparent resin film 6 may cover the entirety of the formed regions of the photodiodes 4, or the transparent resin film 6 may be formed individually in a divided manner according to each photodiode 4 and the omitted portions 6a at which the film is not formed may be formed at the non-formed regions (see FIG. 14). However, in terms of simplifying the manufacturing process, the provision of a single transparent resin film 6 over the entirety of the front surface side is preferable (this point shall be described in detail later).

The photodiode array 1 also has the penetrating wiring 8 provided for each photodiode 4. Each penetrating wiring 8 passes through from the front surface side to the back surface side of the n-type silicon substrate 3, is formed to a diameter of approximately 10 μm to 100 μm (preferably approximately 50 μm), is formed of polysilicon with a phosphorus concentration of approximately $1\times10^{15}$ to $10^{20}/cm^3$, has its front surface side electrically connected to the p-type impurity diffusion layer 5 via the electrode wiring 9 (with a film thickness of approximately 1 μm) formed of aluminum, and has its back surface side electrically connected to the electrode pad 10 (with a film thickness of 0.05 μm to 5 μm and preferably approximately 1 μm) formed likewise of aluminum. To each electrode pad 10, the solder bump electrode 12 is connected via an under-bump metal (UBM) 11, formed of Ni—Au. Though each penetrating wiring 8 is disposed in a non-formed region at which the photodiode 4 is not formed, it may be disposed in another portion instead.

The illustrated photodiode array 1 furthermore has n⁺-type impurity regions (separation layers) 7 provided to a depth of approximately 0.5 to 6 μm between the p-type impurity diffusion layers 5, that is, between the adjacent photodiodes 4. This n⁺-type impurity region (separation layer) 7 has a function of electrically separating the adjacent photodiodes 4, and thus by the provision thereof, the adjacent photodiodes 4 are electrically separated securely and crosstalk among the photodiodes 4 can be reduced. However, even without the provision of the n⁺-type impurity regions 7, the photodiode array 1 has photodetecting characteristics that are adequately allowable in terms of practical use.

Figure 2:
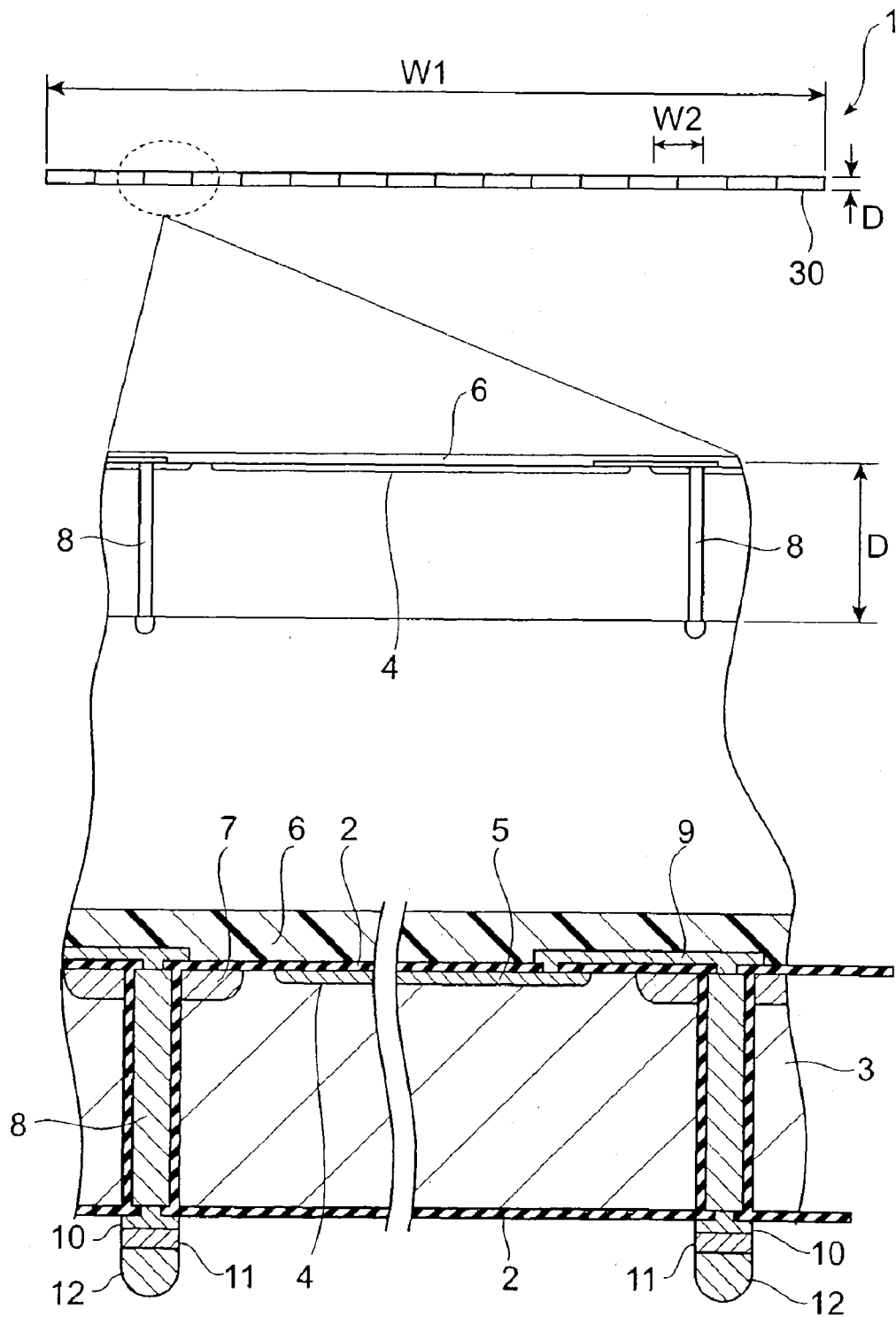
FIG. 2 shows a side view of a semiconductor chip that makes up the photodiode array and sectional views showing the principal portions thereof in enlarged manner.

FIG. 2 shows a side view of the semiconductor chip 30 that makes up the photodiode array 1 and sectional views showing the principal portions thereof in enlarged manner. As shown in FIG. 2, the semiconductor chip 30 has an extremely thin, plate-like form with a width W1 of approximately 22.4 mm and a thickness D of approximately 0.3 mm, has a plurality of the above-described photodiodes 4 (for example, has a two-dimensional array of 16×16 photodiodes), and is a large area (for example, approximately 22.4 mm×22.4 mm) chip wherein pitch W2 between adjacent pixels is approximately 1.4 mm.

With the photodiode array 1 arranged as described above, when light L is made incident from the front surface side, light L to be detected is transmitted through the transparent resin film 6, then made incident on the respective p-type impurity diffusion layers 5, and carriers corresponding to the incident light are generated by the respective photodiodes 4. The photocurrents due to the generated carriers are taken out from the bump electrodes 12 via the electrode wirings 9 and the penetrating wirings 8, connected to the respective p-type impurity diffusion layers 5 and furthermore via the respective electrodes pads 10 and the UBMs 11 at the back surface side. The incident light is detected by these outputs from the bump electrodes 12.

As described above, photodiode array 1 has the transparent resin film 6, which can cover the entire formed regions of the photodiodes 4, provided on the front surface side. Thus when the semiconductor chip 30 is suctioned by a flat collet to be flip-chip bonded, this transparent resin film 6 contacts the flat collet and is positioned in a manner of intervening between the flat collet and the formed regions of the photodiodes 4. The formed regions of the photodiodes 4, which make up the photodetecting portion, is thus protected by this transparent resin film 6 and will not contact the flat collet directly. With the photodiode array 1, since the photodetecting portion thus does not directly receive stress due to pressurization or stress due to heating, the photodetecting portion itself will not receive physical damage and the generation of noise and dark current due to such damage can also be restrained. The photodiode array 1 can thus perform photodetection of high precision (high S/N ratio). Since the transparent resin film 6 can also exhibit the function of a cushion layer that can protect the respective photodiodes 4, it is effective in terms of being able to absorb physical impacts in the process of being suctioned onto the flat collet as well.

Also besides flip-chip bonding, for example, when photodiode array 1 is integrated with a scintillator and used as a CT sensor as shall be described later, since the scintillator will not contact the photodetecting portion directly, damage in the process of mounting the scintillator can also be avoided.

Figure 11:
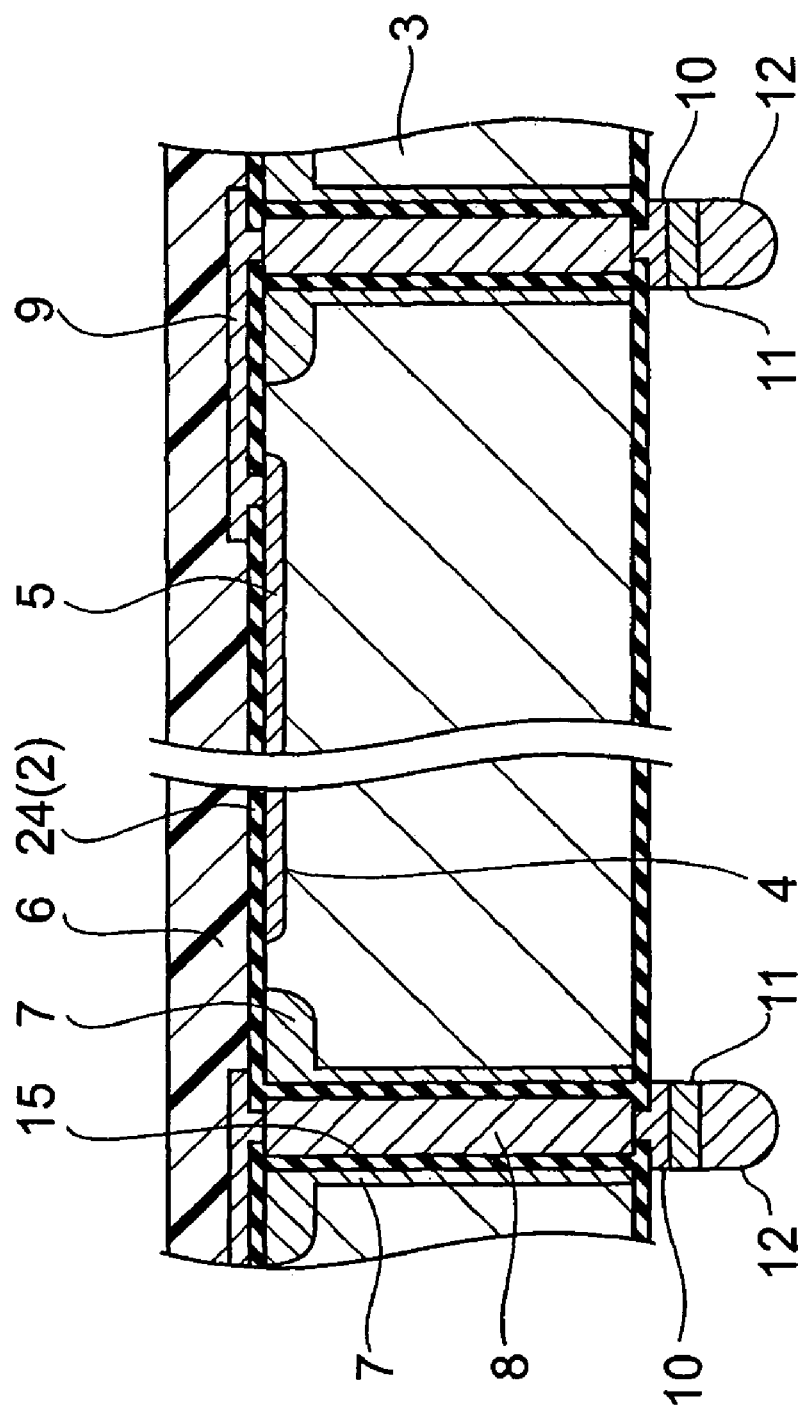
FIG. 11 is an enlarged sectional view of the principal portions of another photodiode array of an embodiment.

The above-described photodiode array 1 may also be arranged as follows. That is, for example as shown in FIG. 11, phosphorus may be diffused in side walls of the pore portions 15 to provide the n⁺-type impurity regions 7 at the surroundings of the penetrating wirings 8 as well. Unnecessary carriers from damaged layers formed in the process of forming the pore portions 15 (hole portions 14) can thereby be trapped to restrain the dark current. The concentration of phosphorus to be added in this case is set to approximately $1\times10^{15}$ to $10^{20}/cm^3$ and the thickness (depth) of each n⁺-type impurity region 7 is set to approximately 0.1 to 5 μm.

Figure 12:
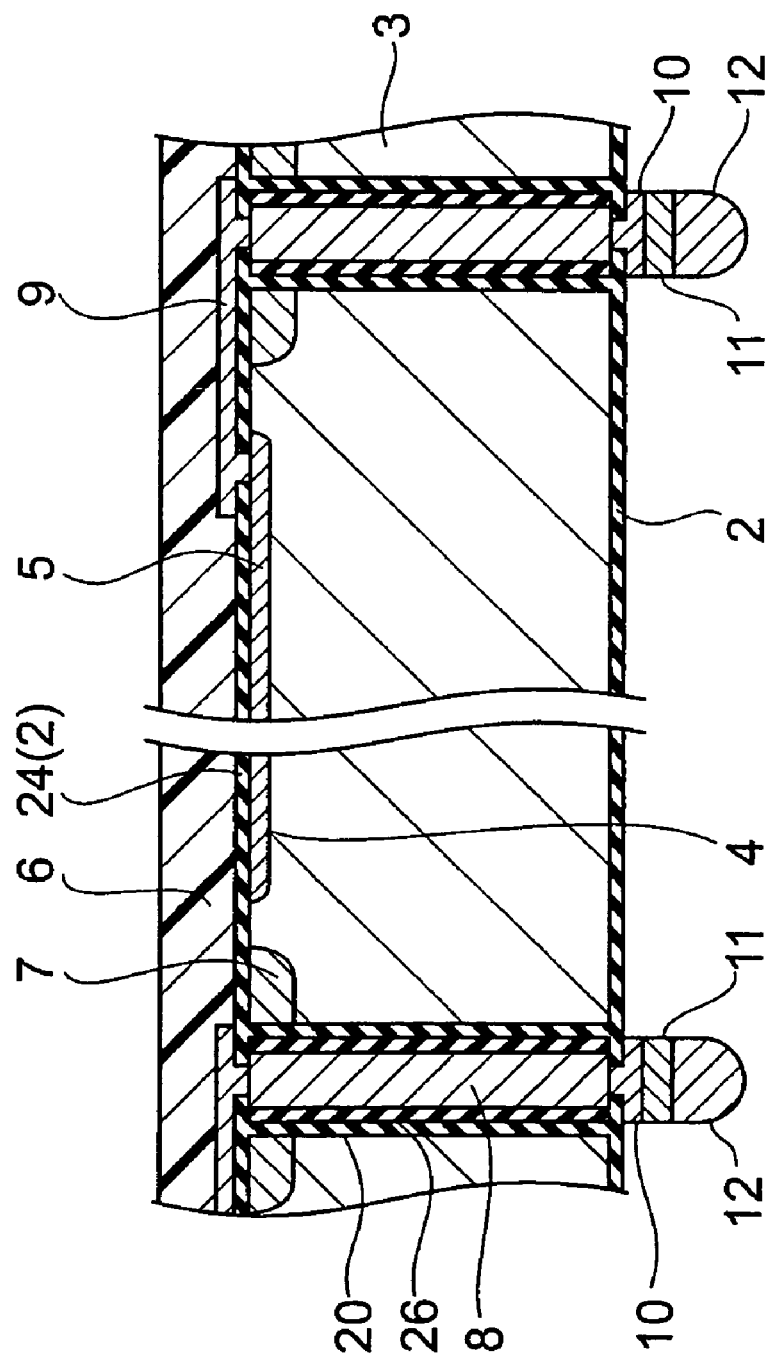
FIG. 12 is a sectional view showing, in enlarged and schematic manner, the principal portions of another photodiode array of an embodiment.

Also as shown in FIG. 12, a silicon nitride film 26 with a film thickness of approximately 0.1 to 2 μm may be disposed on a silicon oxide film 20 inside each pore portion 15. By doing so, the insulation between n-type silicon substrate 3 and penetrating wirings 8 can be secured to reduce operation faults.

Figure 13:
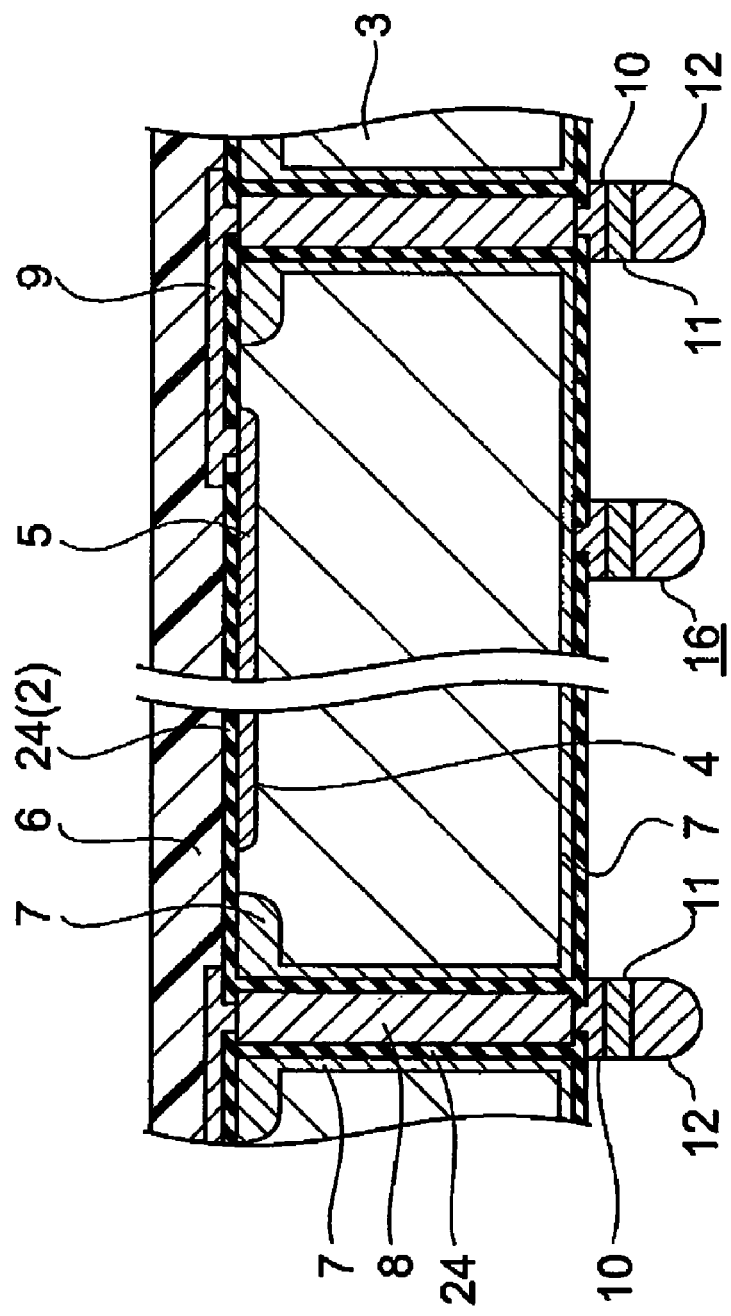
FIG. 13 is a sectional view showing, in enlarged and schematic manner, the principal portions of yet another photodiode array of an embodiment.

Furthermore, the n⁺-type impurity regions 7 may also be provided at the back surface side by doping and diffusing phosphorus as shown in FIG. 13. In this case, cathode electrodes 16 can be led out from the back surface. By doing so, the need to provide penetrating wirings for the cathode is eliminated, thus leading to the lowering of damage, the lowering of dark current, and the lowering of the percent defective. Needless to say, electrodes to serve as cathodes may also be disposed at the back surface side upon providing penetrating wirings from the n⁺-type impurity regions 7 formed on the front surface.

A method of manufacturing the present embodiment's photodiode array 1 shall now be described with reference to FIGS. 3 to 10.

Figure 3:
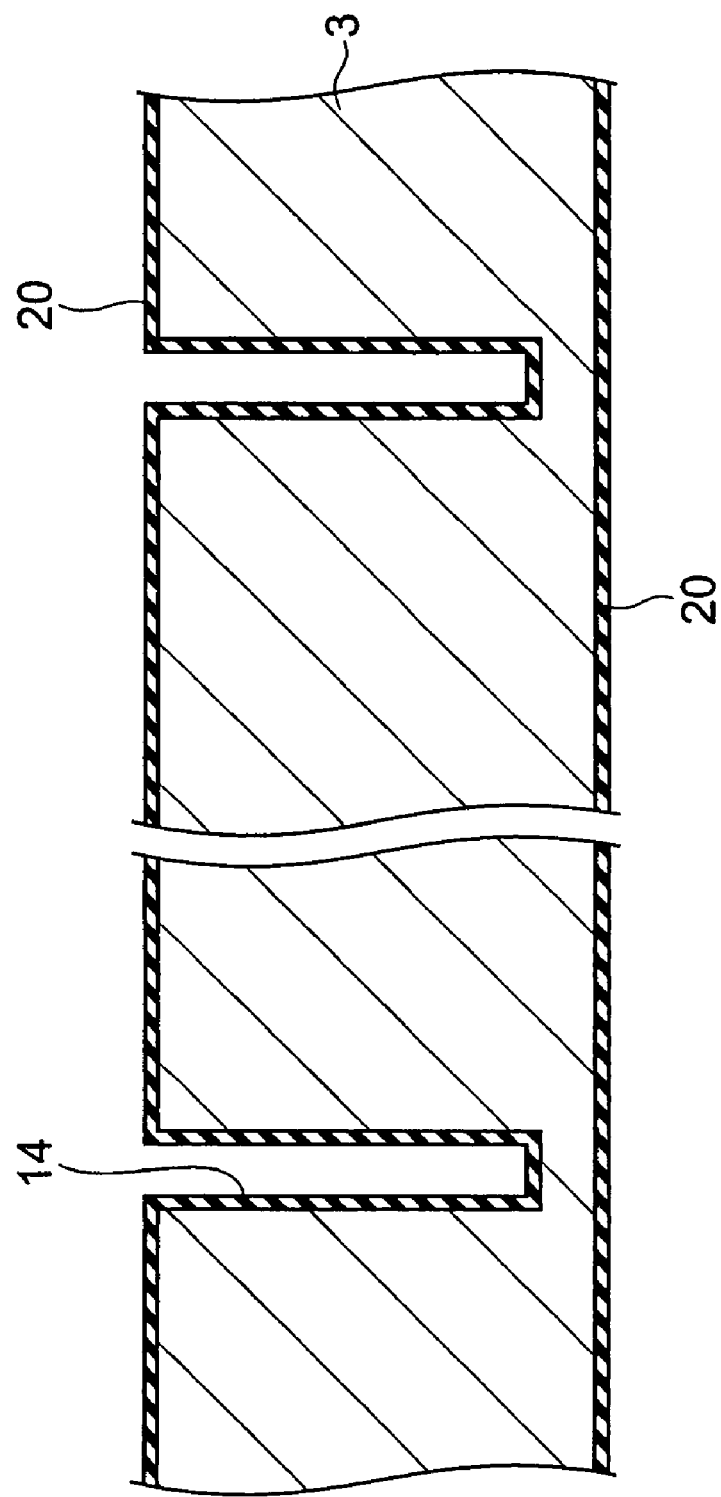
FIG. 3 is an enlarged sectional view of the principal portions that illustrates an intermediate step in a process of manufacturing the photodiode array of the embodiment.

First, the n-type silicon substrate 3 with a thickness of approximately 150 to 500 μm (preferably 400 μm) is prepared. Then as shown in FIG. 3, by ICP-RIE, a plurality of the hole portions 14, which are of a diameter of approximately 10 μm to 100 μm (preferably 50 μm) and do not pass through, are formed in correspondence to the photodiodes 4 to a depth (for example of approximately 100 to 350 μm) that is in accordance with the thickness of the n-type silicon substrate 3 at the surface (this surface shall hereinafter be the front surface and the surface at the opposite side shall be the back surface) of the n-type silicon substrate 3, and thereafter the front surface and the back surface of the substrate are thermally oxidized to form a silicon oxide films ($SiO_2$) 20. In each hole portion 14, the penetrating wiring 8 is formed in a later step. The silicon oxide film ($SiO_2$) 20 realizes the electrical insulation between the penetrating wirings 8 to be described later and n-type silicon substrate 3.

Figure 4:
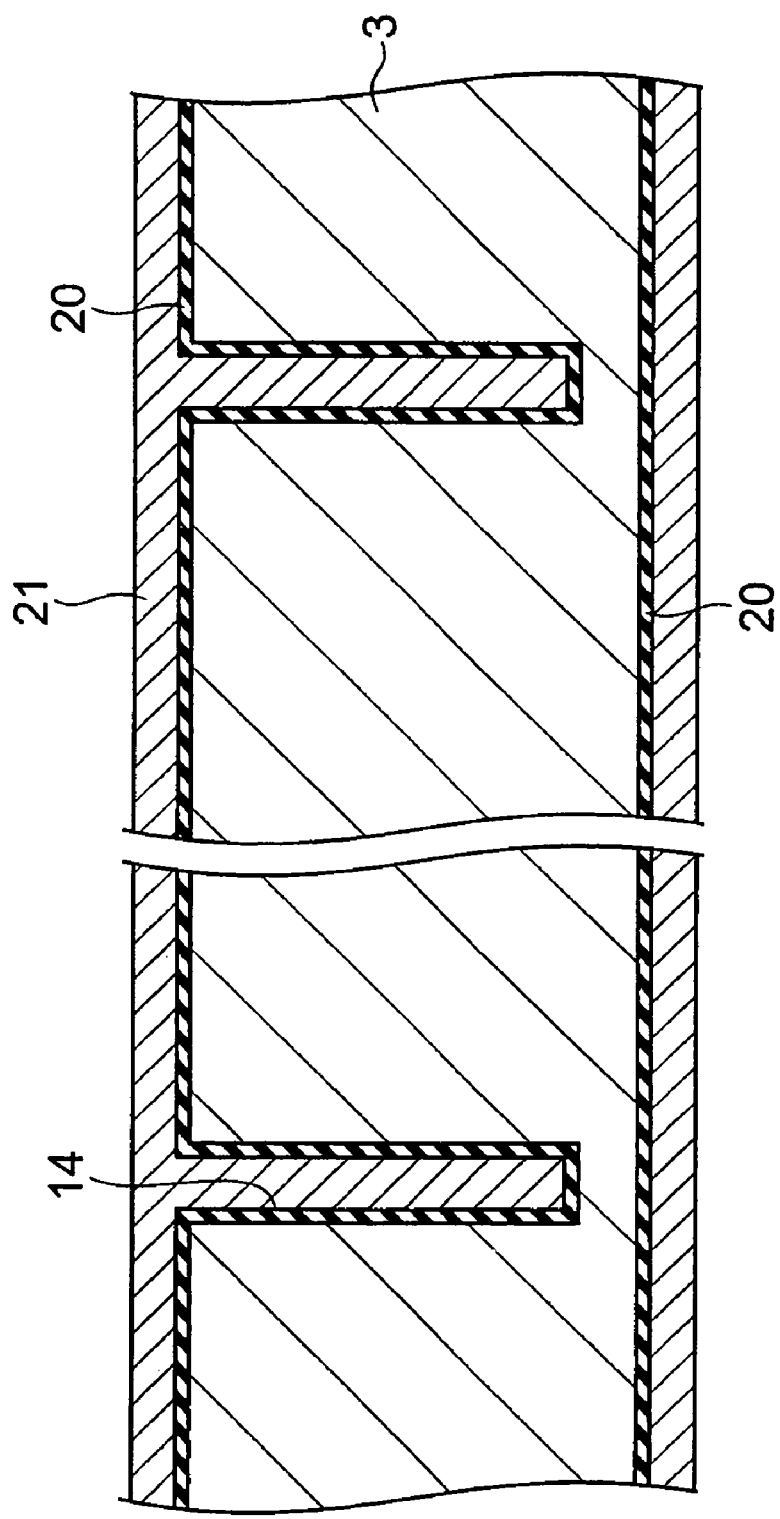
FIG. 4 is an enlarged sectional view of the principal portions that illustrates a step subsequent that of FIG. 3.
Figure 5:
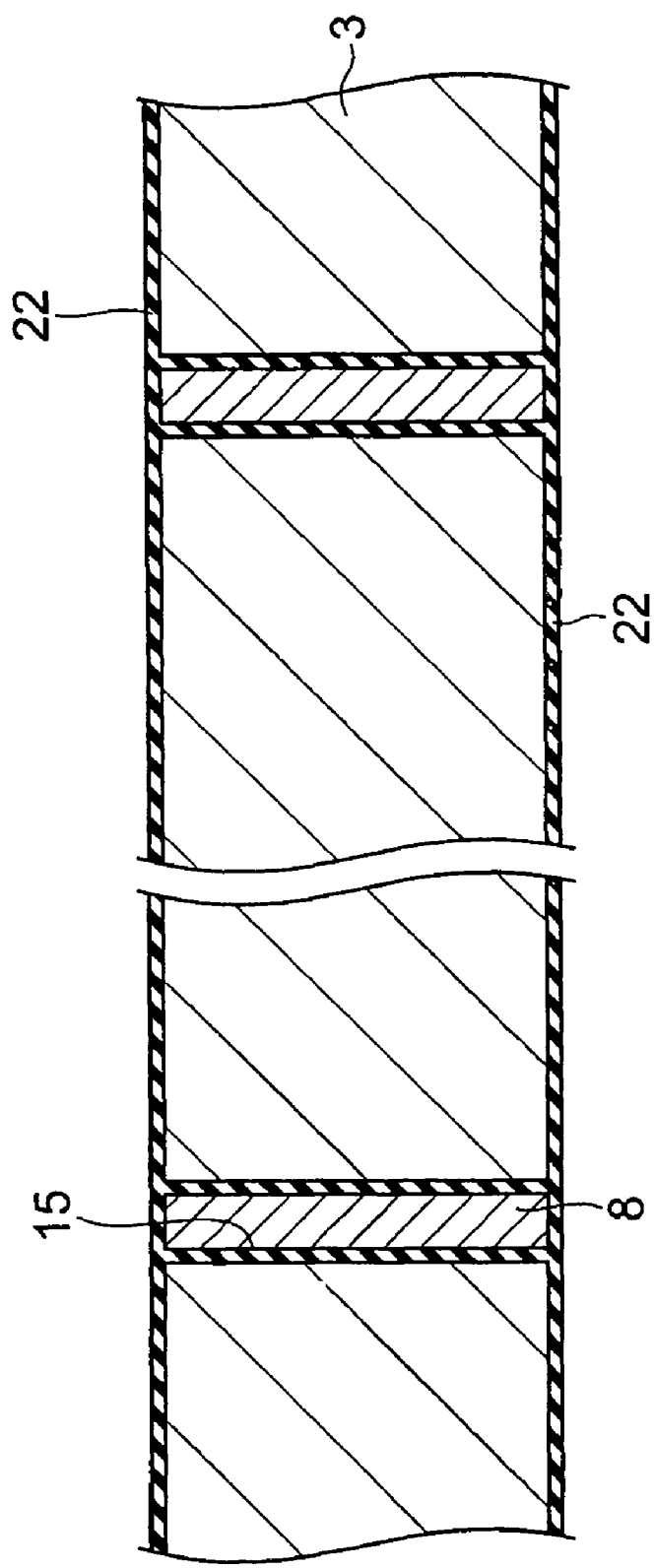
FIG. 5 is an enlarged sectional view of the principal portions that illustrates a step subsequent that of FIG. 4.
Figure 6:
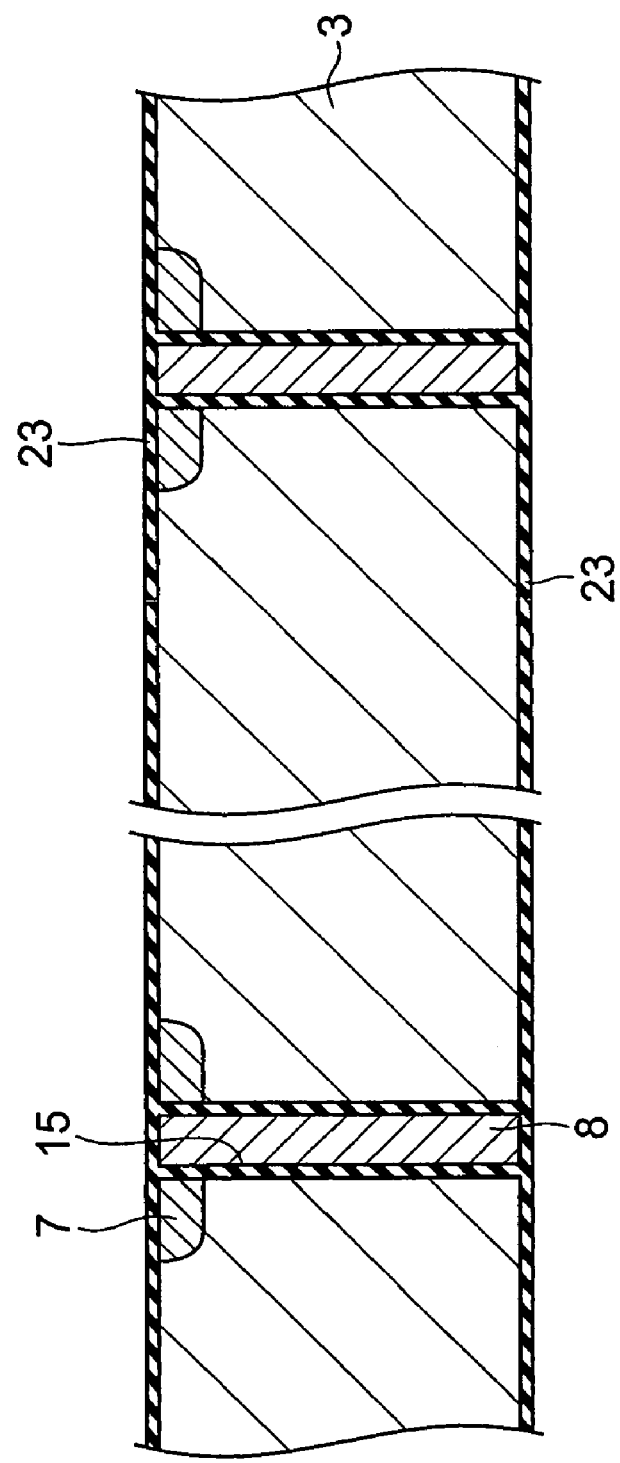
FIG. 6 is an enlarged sectional view of the principal portions that illustrates a step subsequent that of FIG. 5.
Figure 7:
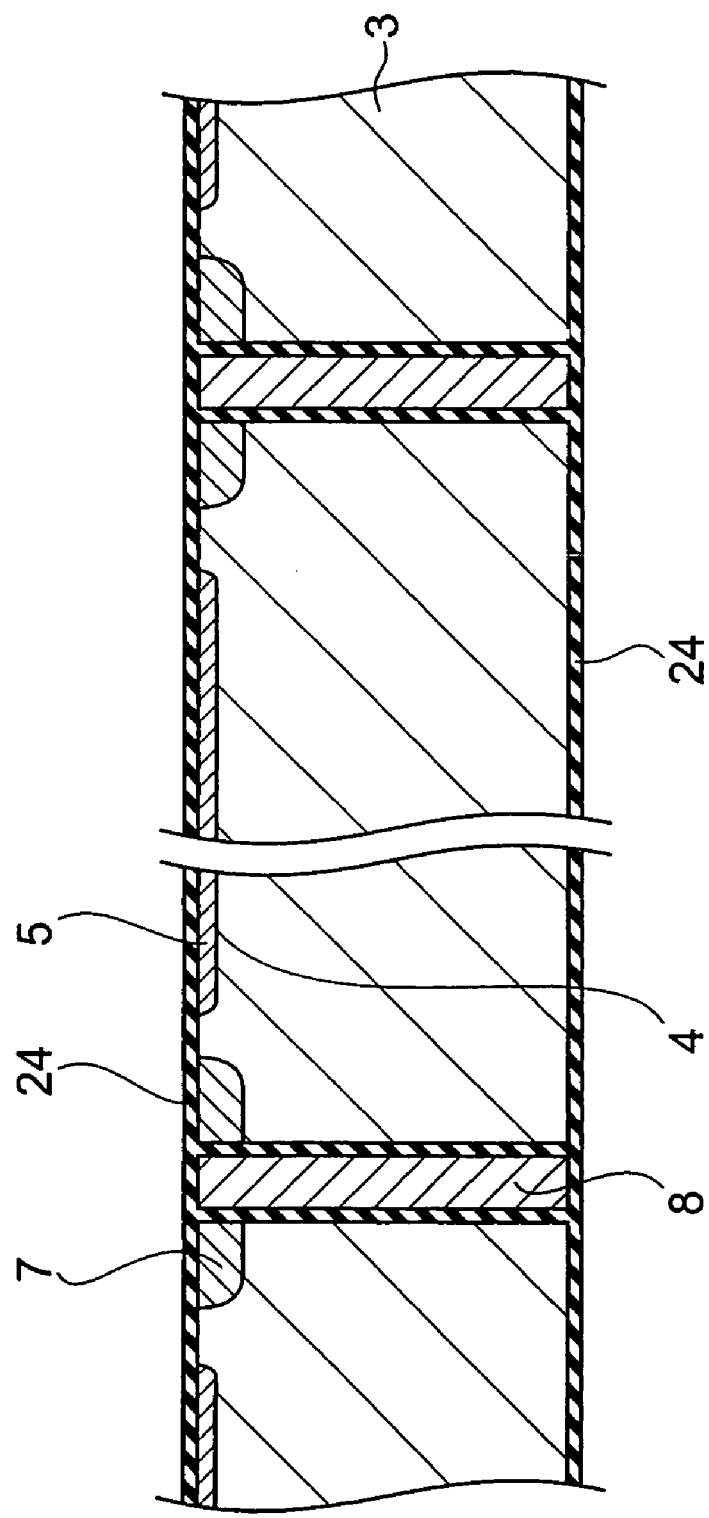
FIG. 7 is an enlarged sectional view of the principal portions that illustrates a step subsequent that of FIG. 6.
Figure 8:
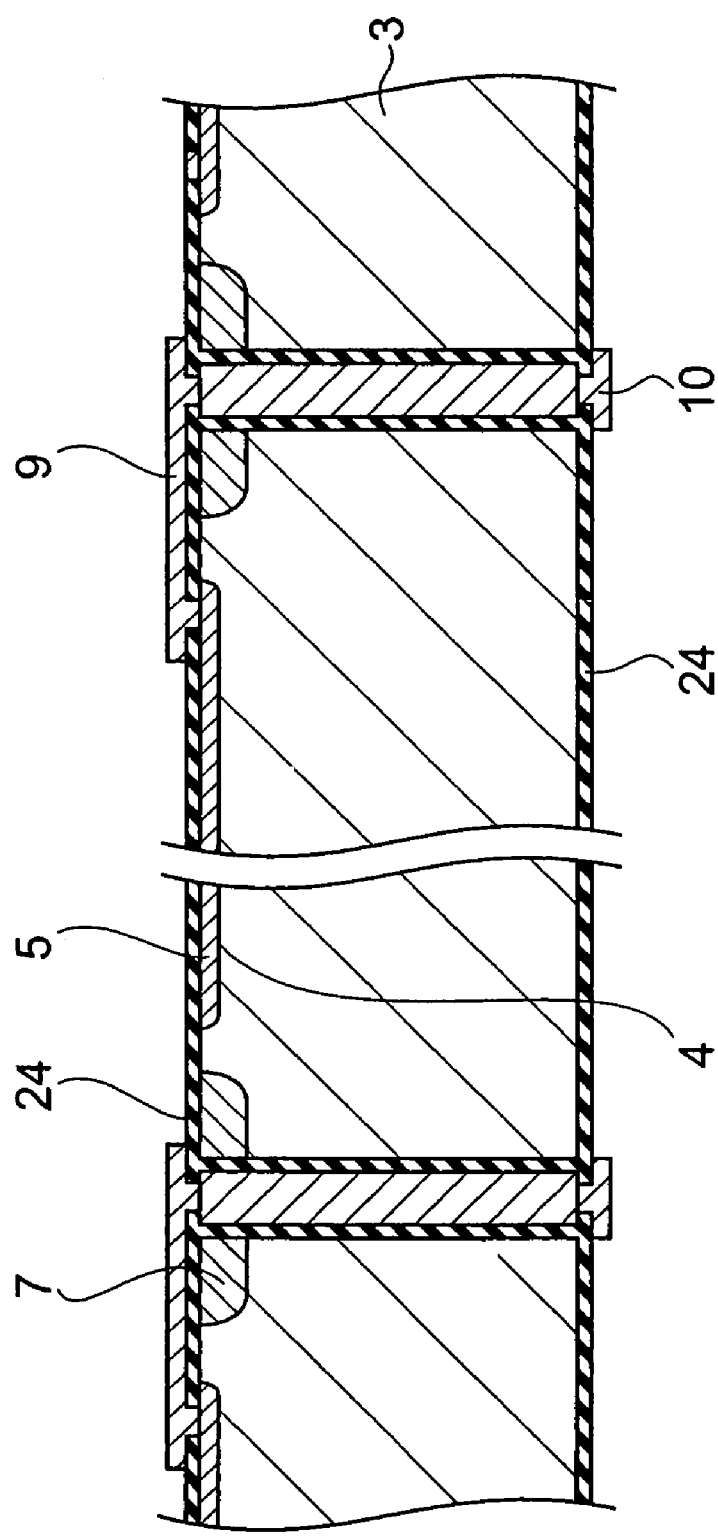
FIG. 8 is an enlarged sectional view of the principal portions that illustrates a step subsequent that of FIG. 7.

Then, as shown in FIG. 4, at the same time as forming a polysilicon film 21 on the front surface and the back surface or just the front surface of the substrate as a conductive coating film having phosphorus added as an impurity, the hole portions 14 are filled by polysilicon that has been made low in resistance by the addition of the impurity. Subsequently as shown in FIG. 5, the front surface and the back surface of the substrate are polished to remove the polysilicon film 21 that had been formed on the front surface and the back surface and expose the polysilicon embedded in the hole portions 14 at the front surface and the back surface and thereby form the pore portions 15 passing through between the surfaces at both sides and make the embedded polysilicon become the penetrating wirings 8. The front surface and the back surface of the substrate are then thermally oxidized again to form the silicon oxide films 22. These silicon oxide films 22 are used as $n^+$ thermal diffusion masks in a subsequent step.

The silicon oxide film 22 at the front surface side of the n-type silicon substrate 3 is then patterned using a predetermined photomask to open just the regions at which the $n^+$-type impurity regions 7 are to be provided, and phosphorus is diffused from the opened portions (open portions) to provide the $n^+$-type impurity regions 7 (in the case where the $n^+$-type impurity regions 7 are not to be provided this step (impurity region forming step) may be omitted). Thereafter, the front surface and the back surface of the substrate are thermally oxidized again to form the silicon oxide films 23 (see FIG. 6). These silicon oxide films 23 are used as masks in the process of forming the p-type impurity diffusion layers 5.

Patterning using a predetermined photomask is then performed on the silicon oxide film 23 and just the regions at which the p-type impurity diffusion layers 5 are to be formed are opened. Boron is then diffused from the opened portions and the p-type impurity diffusion layers 5 are formed so as to be arrayed vertically and horizontally in a two-dimensional array. Thereafter, the front surface and the back surface of the substrate are thermally oxidized again to form silicon oxide films 24 (see FIG. 7). The photodiodes 4, formed by the pn junctions of the respective p-type impurity diffusion layers 5 and the n-type silicon substrate 3 are thus formed so as to be arrayed vertically and horizontally in a two-dimensional array and these photodiodes 4 become portions corresponding to pixels.

Contact holes are then formed at the regions at which the respective penetrating wirings 8 are formed. Subsequently, upon forming aluminum metal films over the entire front surface and back surface, patterning is performed using a predetermined photomask and unnecessary portions of the metal film are removed to form the electrode wirings 9 at the front surface side and the electrode pads 10 at the back surface side (see FIG. 8). In the FIGURE, just the anode electrode lead-out portions are shown. Though not illustrated, to lead out cathode electrodes from a surface, electrodes can be lead out from the $n^+$-type impurity regions 7 to the back surface via the electrode wirings 9 and penetrating wirings 8.

Figure 9:
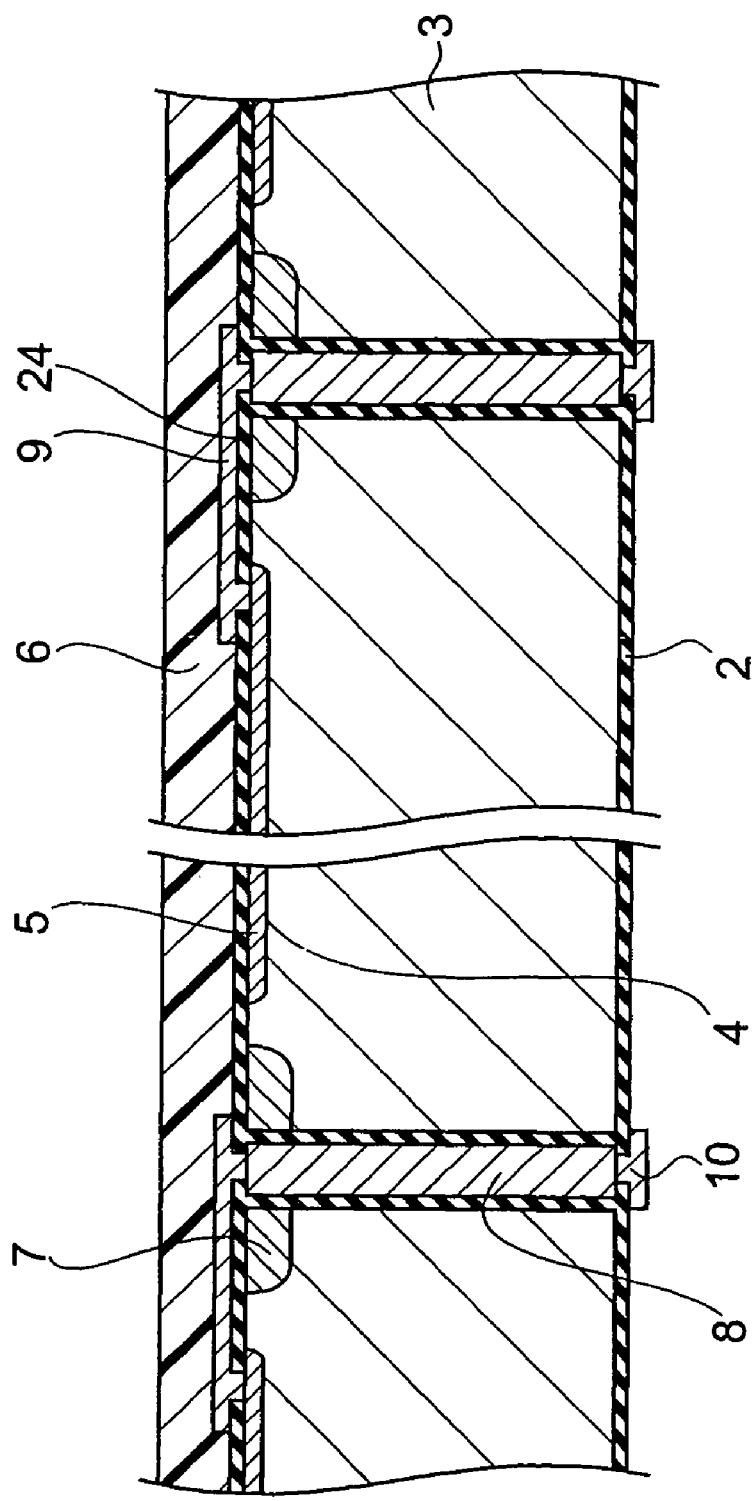
FIG. 9 is an enlarged sectional view of the principal portions that illustrates a step subsequent that of FIG. 8.

An epoxy resin, a polyimide resin, a silicone resin, a fluorine resin, an acrylate resin or a compound material resin having these resins as the base material, which is to be the material of the transparent resin film 6, is then coated onto the front surface side of the n-type silicon substrate 3 and cured upon being spread over the entire surface by spin coating or screen printing to thereby provide the transparent resin film 6 (see FIG. 9). By the provision of this transparent resin film 6, the formed regions of the photodiodes 4 that make up the photodetecting portion are protected. To form the above-mentioned omitted portions 6a in the transparent resin film 6, the coat is removed from the portions corresponding to the omitted portions 6, and even in this case, the formed regions of the photodiodes 4 will be protected.

Figure 10:
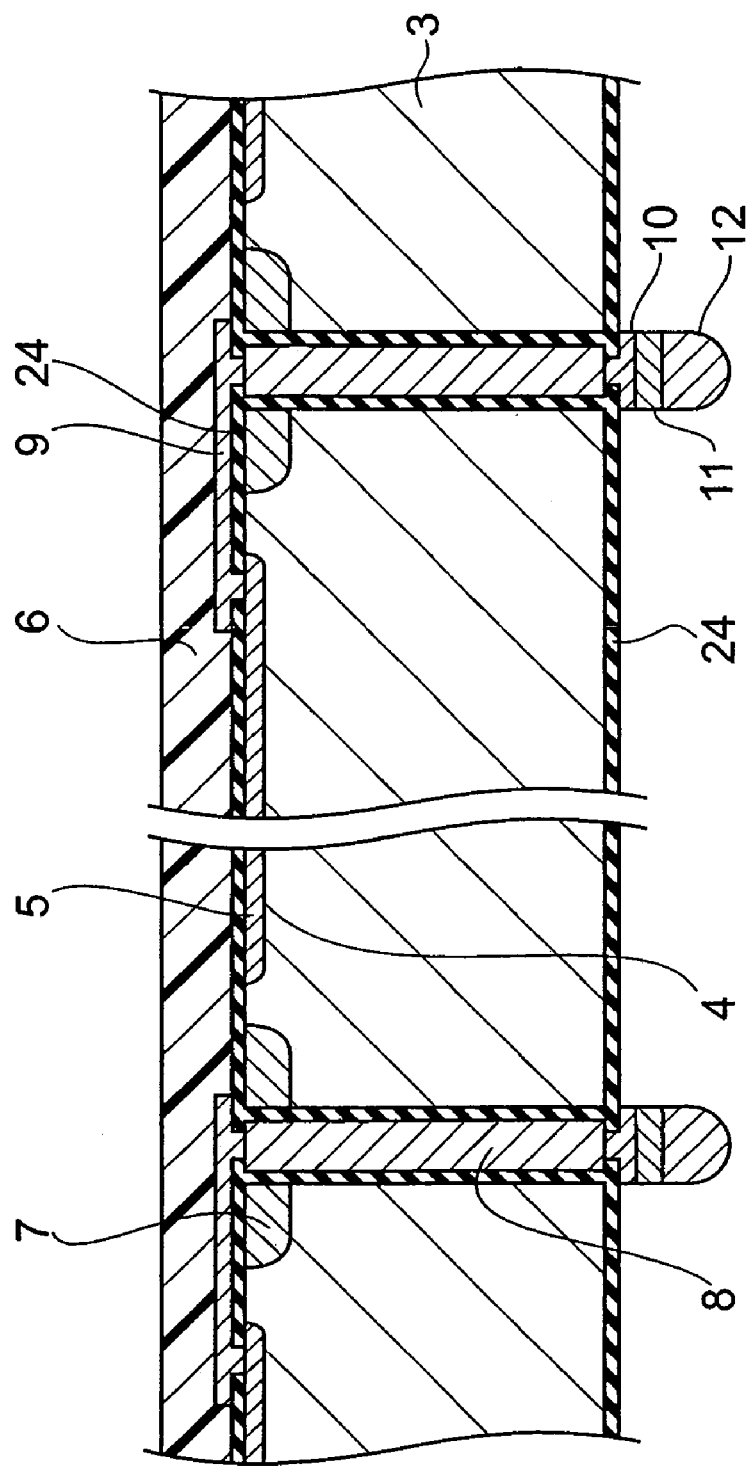
FIG. 10 is an enlarged sectional view of the principal portions that illustrates a step subsequent that of FIG. 9.

Bump electrodes 12 are then provided at the respective electrode pads 10, and in the case where solder is to be used as the bump electrodes 12, since solder is poor in wettability with respect to aluminum, UBMs 11 for intervening between the respective electrode pads 10 and the bump electrodes 12 are formed on the respective electrode pads 10 and bump electrodes 12 are formed overlappingly on the UBMs 11 (see FIG. 10). By the above steps, a photodiode array 1, with which noise due to damage during mounting will not be generated and which enables photodetection of high precision, can be manufactured. Though in this case, the UBMs 11 are formed by electroless plating and using Ni—Au, the UBMs may be formed instead by the lift-off method and using Ti—Pt—Au or Cr—Au. Also, the bump electrodes 12 are obtained by forming solder on predetermined the UBMs 11 by a solder ball mounting method or printing method and performing reflow. The bump electrodes 12 are not limited to those formed of solder and may be gold bumps, nickel bumps, or copper bumps or even conductive resin bumps, which contain a conductive filler or other metal.

Figure 15:
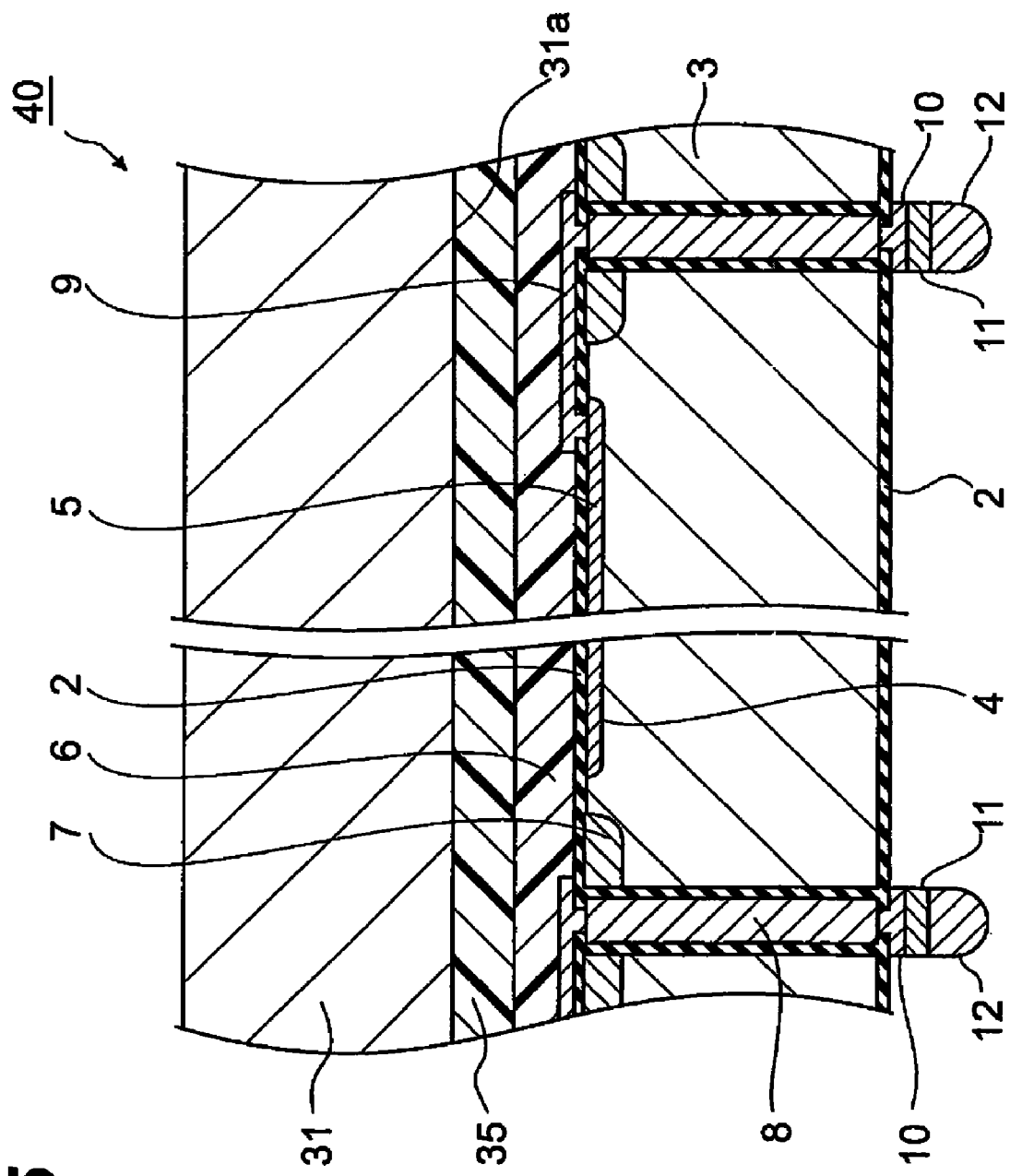
FIG. 15 is a sectional view showing, in enlarged and schematic manner, the principal portions of a radiation detector with a photodiode array of an embodiment.
Figure 17:
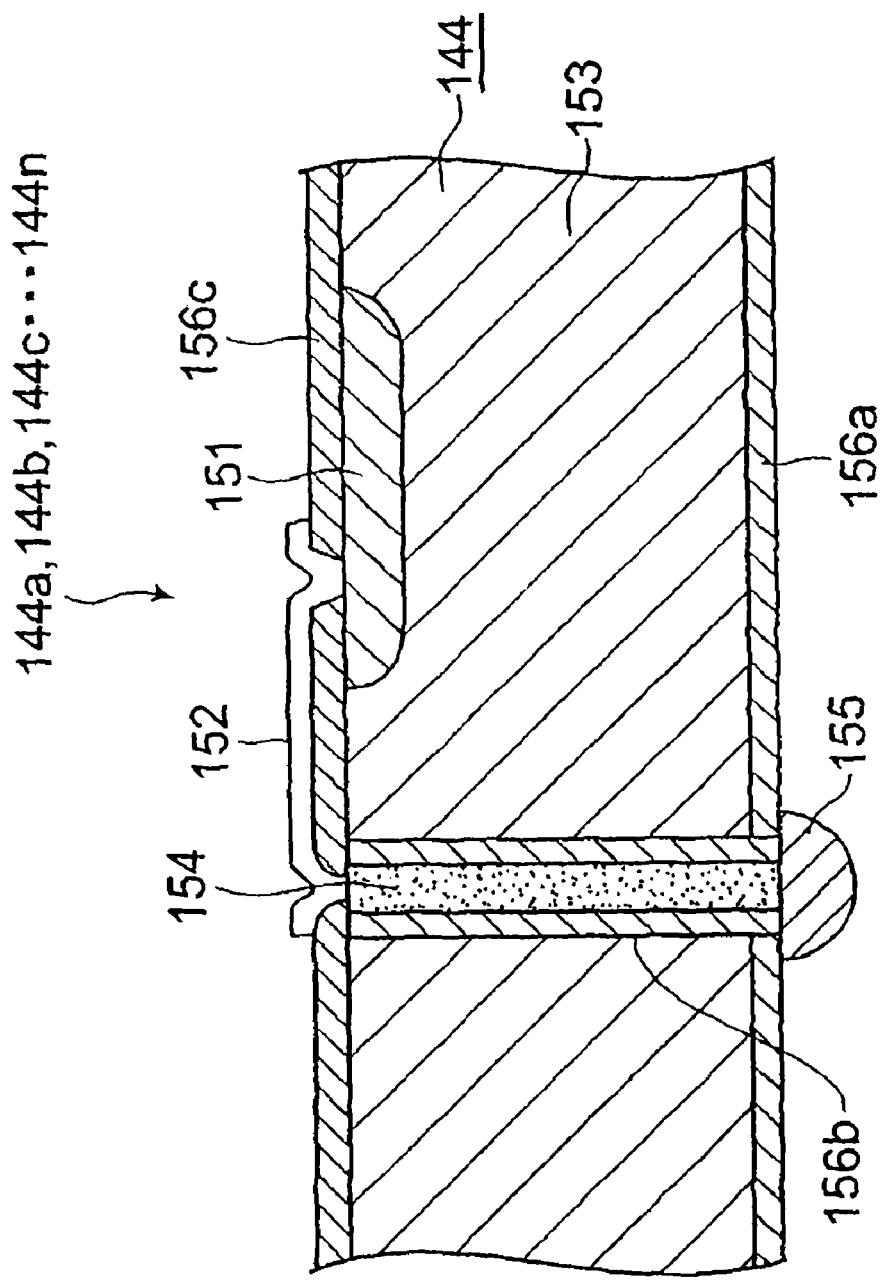
FIG. 17 is a sectional view showing a photodiode array of a conventional art.

An embodiment of this invention's radiation detector shall now be described. FIG. 15 is sectional side view of the radiation detector 40 of the embodiment. This radiation detector 40 has the scintillator panel 31, onto which radiation is made incident and which emits light, generated as a result of the radiation, from a light emitting surface 31a, and the above-described photodiode array 1, onto which the light emitted from the scintillator panel 31 is made incident and which converts the light to electrical signals. This radiation detector 40 is characterized in having this invention's photodiode array 1.

The scintillator panel 31 is mounted to the front surface side (incidence surface side) of photodiode array, and the photodiode array 1 has the above-described transparent resin film 6 disposed at its front surface side. Though the back surface of the scintillator 31, that is, the light emitting surface 31 a will thus contact the transparent resin film 6, it will not contact the formed regions of photodiodes 4 directly. Also, the optical resin 35, having a refractive index such that will prevent the degradation of the light transmitting characteristics, is filled between the light emitting surface 31a of the scintillator panel 31 and the transparent resin film 6. By this optical resin 35, the light emitted from the scintillator panel 31 is made incident on photodiode array 1 efficiently. As this optical resin 35, an epoxy resin, acrylic resin, urethane resin, silicone resin, fluorine resin, etc., having the property of transmitting the light emitted from the scintillator panel 31, may be used or a composite material having these resins as the base material may be used.

In bonding the photodiode array 1 onto an unillustrated mounting wiring substrate, the front surface is suctioned by a flat collet. However, since the above-described transparent resin film 6 is provided on the front surface of the photodiode array 1, the suctioning surface of the flat collet will not contact the photodetecting portion directly, and direct contacting of the light emitting surface 31a with the formed regions of the photodiodes 4 due to the mounting of the scintillator 31 will also not occur. Since with the radiation detector 40, having such the photodiode array 1 and the scintillator panel 31, the generation of noise, dark current, etc. due to the damaging of the photodetecting portion in the mounting process can be prevented, photodetection can be performed with high precision and the detection of radiation can also be performed at high precision.

Industrial Applicability

As has been described in detail above, by the present invention, the generation of noise, dark current, etc. due to the damaging of the photodetecting portion in the mounting process can be prevented effectively in a photodiode array, a method of manufacturing the same, and a radiation detector.

The invention claimed is:

1. A radiation detector comprising:
 a photodiode array comprising:
  a semiconductor substrate, wherein a plurality of photodiodes are formed in array form on a surface onto which light to be detected is made incident, and the semiconductor substrate has penetrating wirings, which pass through from the incidence surface side to the back surface side, formed for the photodiodes; and
  a transparent resin film, which covers at least the regions at which the photodiodes are formed and transmits the light to be detected, is disposed on the incidence surface side of the semiconductor substrate, the transparent resin film functioning as a cushion layer protecting the regions at which the photodiodes are formed, wherein the thickness of the transparent resin film is within the range of 1 to 50 μm;
 a scintillator panel, mounted to the side of the photodiode array onto which the light to be detected is made incident and emits light due to incident radiation, wherein a surface of the transparent resin film onto which the scintillator panel is mounted is flat; and
 an optical resin transmitting the light emitted from the scintillator panel, wherein the scintillator panel is mounted to the flat surface via the optical resin.

2. The radiation detector according to claim 1, wherein the entire surface of the transparent resin film onto which the scintillator panel is mounted is flat.

3. The radiation detector according to claim 1, wherein the transparent resin film has an elastic modulus of 10 to 12000 kg/cm$^2$.

4. The radiation detector according to claim 1, wherein the semiconductor substrate has impurity regions, which separate the respective photodiodes, disposed between the adjacent photodiodes, the impurity regions surrounding each of the penetrating wirings.

5. The radiation detector according to claim 1, wherein the semiconductor substrate has a further impurity region which is provided on the back surface.

6. A radiation detector manufacturing method, wherein a photodiode array is manufactured by conducting:
 a first step of forming, in a semiconductor substrate, formed of a semiconductor of a first conductive type, penetrating wirings that pass through between the respective surfaces of the semiconductor substrate;
 a second step of adding an impurity to predetermined regions of a surface at one side of the semiconductor substrate to form a plurality of impurity diffusion layers of a second conductive type and forming a plurality of photodiodes arrayed in array form from the respective impurity diffusion layers and the semiconductor substrate; and
 a third step of providing on the surface at one side of the semiconductor substrate, a transparent resin film that covers at least the regions at which the photodiodes are formed, the transparent resin film functioning as a cushion layer protecting the regions at which the photodiodes are formed, wherein the thickness of the transparent resin film is within the range of 1 to 50 μm;
 thereafter the radiation detector manufacturing method comprising the steps of:
  bonding the photodiode array onto a mounting wiring substrate; and
  mounting a scintillator panel to the transparent resin film of the photodiode array via an optical resin transmitting the light emitted from the scintillator panel, wherein the scintillator panel is mounted to the side of the photodiode array onto which light to be detected is made incident and emits light due to incident radiation.

7. The radiation detector manufacturing method according to claim 6, wherein
 the first step comprises:
  a step of forming a plurality of hole portions in the semiconductor substrate;
  a step of forming a conductive coating film on a surface of at least one side of the semiconductor substrate including the respective hole portions; and
  a step of polishing the conductive coating film to remove the conductive coating film from the semiconductor substrate.

8. The radiation detector manufacturing method according to claim 6, wherein subsequent to the first step is provided a step, of adding, between adjacent regions to which the impurity is to be added, another impurity to form impurity regions of the first conductive type.

9. The radiation detector manufacturing method according to claim 6, wherein the transparent resin film has an elastic modulus of 10 to 12000 kg/cm$^2$.

* * * * *